US007067428B2

(12) United States Patent
Hori

(10) Patent No.: US 7,067,428 B2
(45) Date of Patent: Jun. 27, 2006

(54) METHOD FOR CLEANING POLYSILICON

(75) Inventor: Kenji Hori, Tokyo (JP)

(73) Assignee: Mitsubishi Materials Silicon Corp., Tokyo (JP)

( * ) Notice: Subject to any disclaimer, the term of this patent is extended or adjusted under 35 U.S.C. 154(b) by 0 days.

(21) Appl. No.: 10/185,400

(22) Filed: Jun. 27, 2002

(65) Prior Publication Data

US 2002/0166577 A1 Nov. 14, 2002

Related U.S. Application Data

(63) Continuation of application No. 09/851,699, filed on May 8, 2001, now abandoned.

(51) Int. Cl.
*H01L 21/302* (2006.01)

(52) U.S. Cl. ........................................ 438/692; 438/906

(58) Field of Classification Search ................. 438/594, 438/697, 691–692, 703, 745, 753, 756, 758, 438/770, 906
See application file for complete search history.

(56) References Cited

U.S. PATENT DOCUMENTS 5,904,574 A * 5/1999 Nishijima .................. 438/758
6,100,198 A * 8/2000 Grieger et al. .............. 438/692

* cited by examiner

*Primary Examiner*—David Nelms
*Assistant Examiner*—David Vu
(74) *Attorney, Agent, or Firm*—Reed Smith LLP

(57) ABSTRACT

A method for cleaning polysilicon comprises steps of cleaning solid or granular polysilicon with an aqueous solution of dissolved ozone, and of cleaning with hydrofluoric acid the polysilicon receiving the above cleaning based on an aqueous solution of dissolved ozone, wherein the above steps are executed once in this order, or the above steps are repeated once or more in this order. Subsequent to the last cleaning step using hydrofluoric acid, a still other step of cleaning the polysilicon with pure water and then drying it is preferably added.

This method for cleaning polysilicon allows organic materials, particles and metal impurities adsorbed on the surface of polysilicon to be removed at a low cost, and to increase the freeing rate.

5 Claims, 1 Drawing Sheet

METHOD FOR CLEANING POLYSILICON

CROSS-REFERENCE TO RELATED APPLICATIONS

This application is a continuation of U.S. application Ser. No. 09/851,699, filed on May 8, 2001, now abandoned.

BACKGROUND OF THE INVENTION

1. Field of the Invention

The present invention relates to a method for cleaning polysilicon (polycrystalline silicon) to serve as a material for the manufacture of silicon single crystals.

2. Prior Art

Silicon single crystals for semiconductor devices have been principally manufactured by the Czochralski method (to be referred to as Cz method hereinafter). The Cz method consists of melting solid or granular polysilicon in a quartz crucible in a furnace, immersing a crystal seed into the melt thus obtained, raising the crystal seed thereby allowing single silicon crystals to grow. Because polysilicon to serve as a material for the manufacture of single silicon crystals has a high reactivity, it is stored being helmetically sealed in a plastic bag just until it is transferred into a quartz crucible. However, when polysilicon is placed in a bag for sealing, or removed from a bag for use, it often reacts with oxygen in the air to form thereby an oxide film on its surface. The oxide film may have organic materials, particles or metal impurities adsorbed on its surface. If polysilicon with such organic materials or the like adsorbed on its surface is melt, the growth of single silicon crystals is disturbed so that the freeing rate (the weight ratio of a single silicon crystal obtained from a unit weight of polysilicon) is problematically reduced.

To serve as a solution to the above problem, a method has been known in which polysilicon is cleaned with a mixed acid comprising hydrofluoric acid and nitric acid just before the polysilicon is transferred into a crucible. With this method, however, organic materials and others dissolving in the mixed acid may easily re-adsorb on the surface of polysilicon. Thus, with this method it has been difficult to remove organic materials. Moreover, the method requires such a large quantity of the mixed acid that the cost for cleaning is increased.

SUMMARY OF THE INVENTION

The object of the present invention is to provide a method for cleaning polysilicon capable of removing organic materials, particles and metal impurities adsorbed on the surface of polysilicon at a low cost to thereby increase the freeing rate.

The first aspect of the present invention resides in a method for cleaning polysilicon which comprises the steps of cleaning solid or granular polysilicon with an aqueous solution of dissolved ozone, and of cleaning with hydrofluoric acid polysilicon just cleaned with the above aqueous solution of dissolved ozone, and includes executing, in the above order, the above steps once, or repeating the above steps once or more.

According to the first aspect of the present invention, the surface of polysilicon is oxidized by cleaning polysilicon with an aqueous solution of dissolved ozone to thereby form an oxide film thereon. The oxide film is removed when cleaned with hydrofluoric acid, and thus organic materials, particles and metal impurities which might be adsorbed on the oxide film will be removed together with the oxide film. Repeating the step will further enhance the removal of such impurities.

The second aspect of the present invention resides in a method for cleaning polysilicon based on the first aspect of the present invention which further comprises, following the last step of cleaning with hydrofluoric acid, steps of cleaning polysilicon with pure water, and of drying it.

According to the second aspect of the present invention, addition of the step of cleaning polysilicon with pure water will further enhance the effectiveness of the method with regard to the removal of organic materials, particles and metal impurities.

The third aspect of the present invention resides in a method for cleaning polysilicon based on the first or second aspect of the present invention wherein the concentration of ozone of the aqueous solution of dissolved ozone is from 3 to 20 ppm, and the concentration of hydrofluoric acid is from 0.1 to 5 wt. %.

According to the third aspect of the present invention, by setting the concentration of ozone of the aqueous solution of dissolved ozone and the concentration of hydrofluoric acid in the above ranges, the effectiveness of the method with regard to the removal of organic materials, particles and metal impurities will be further enhanced.

The fourth aspect of the present invention resides in a method for cleaning polysilicon based on the first to third aspect of the present invention wherein the cleaning step using an aqueous solution of dissolved ozone comprises, steps of jetting an aqueous solution of dissolved ozone at solid or granular polysilicon placed in a chemically resistant basket, and of immersing the basket containing the polysilicon in an aqueous solution of dissolved ozone.

According to the fourth aspect of the present invention, combining the step of jetting an aqueous solution of dissolved ozone at polysilicon and the step of immersing polysilicon in an aqueous solution of dissolved ozone will further enhance the effectiveness of the method with regard to the removal of organic materials, particles and metal impurities.

The fifth aspect of the present invention resides in a method for cleaning polysilicon based on the fourth aspect of the present invention wherein the cleaning step using hydrofluoric acid comprises a step of immersing in hydrofluoric acid polysilicon, being contained in a chemically resistant basket, which has been immersed in an aqueous solution of dissolved ozone.

According to the fifth aspect of the present invention, introduction of the step using hydrofluoric acid will further enhance the effectiveness of the method with regard to the removal of oxide film, organic materials, particles and metal impurities.

DESCRIPTION OF THE PREFERRED EMBODIMENTS

Figure 1:
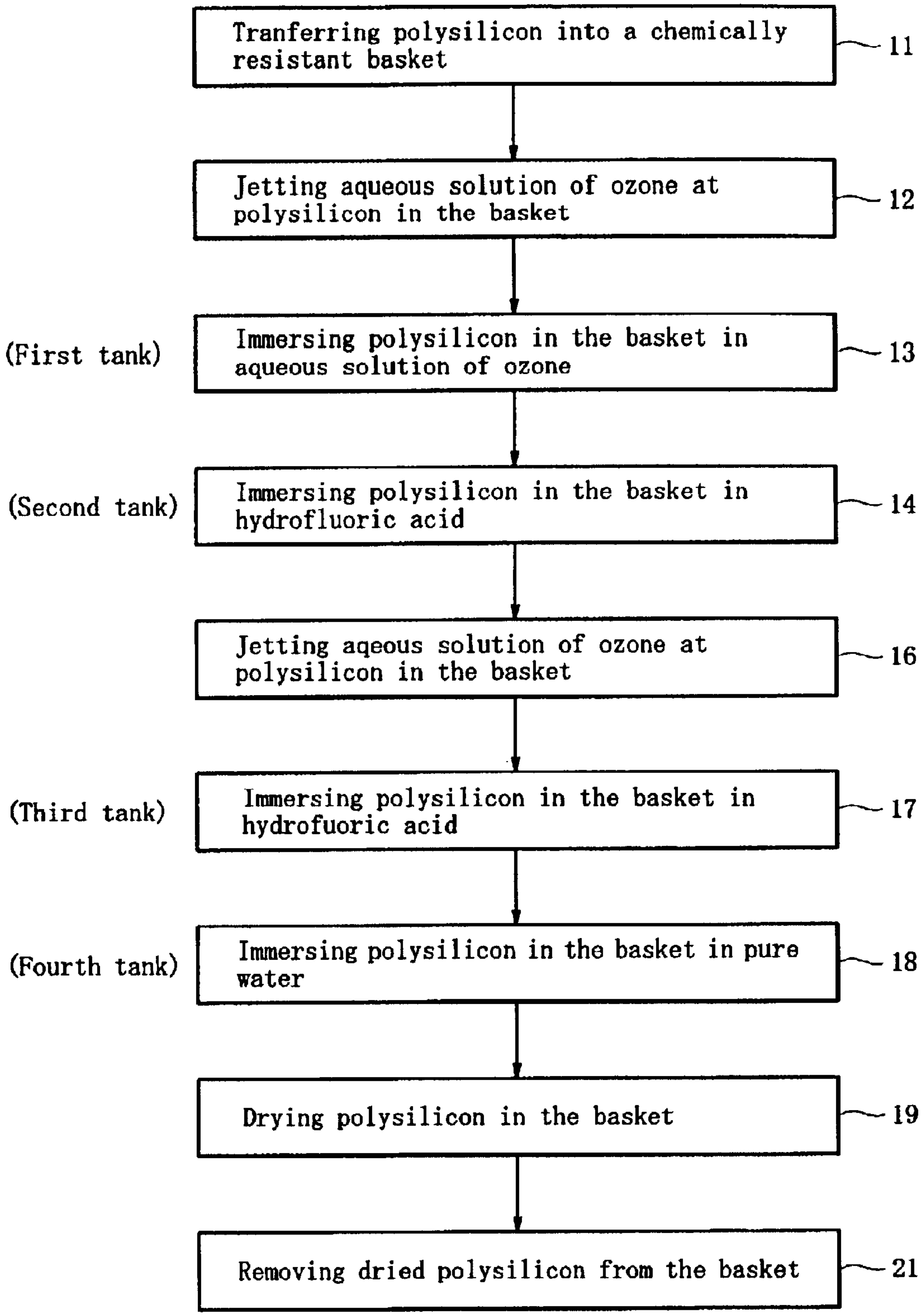
FIG. 1 illustrates the steps of cleaning polysilicon according to the present invention.

The aqueous solution of dissolved ozone used in this invention is highly pure, has a high oxidizing activity even at a low concentration, and is readily available. The concentration of ozone of the aqueous solution of dissolved ozone is preferably 3 ppm or higher. If it were below 3 ppm, its oxidizing activity towards the surface of polysilicon would be insufficient, whereas if it were beyond 20 ppm, it would damage the containers that might come into contact with the aqueous solution of dissolved ozone. More preferably, the ozone concentration of the aqueous solution of dissolved ozone is kept at 5 to 15 ppm. The hydrofluoric acid used in this invention has a concentration of 0.1 to 5 wt. %. Particularly preferably it has a concentration of 0.1 to 1 wt. %, or more preferably 0.5 wt. %. If the concentration were below 0.1 wt. %, it would not remove organic materials, particles and metal impurities satisfactorily. If the concentration were beyond 5 wt. %, it would undesirably raise the cost for cleaning.

An embodiment representing a method for cleaning polysilicon according to the present invention will be described with reference to FIG. 1.

As shown in step 11 of FIG. 1, solid or granular polysilicon is placed in a chemically resistant basket. The material to be used for the manufacture of such a chemically resistant basket may include fluorine resins of polyethylene, polypropylene, polytetrafluoroethylene (Teflon), etc. Then, as shown in step 12, an aqueous solution of dissolved ozone is jetted at the polysilicon contained in the basket. The jetting takes place through a jet nozzle or shower. If an aqueous solution of dissolved ozone is jetted at polysilicon contained in a basket which has been placed in a vessel, then it will be possible to recover the aqueous solution of dissolved ozone flowing out from the basket and reuse it as a part of the aqueous solution of dissolved ozone which will be used in the next step 13. Then, as shown in step 13, the basket containing polysilicon is immersed in an aqueous solution of dissolved ozone. The immersion takes place by transferring the basket in a first tank (not illustrated) filled with an aqueous solution of dissolved ozone.

Then, as shown in step 14, the basket containing polysilicon is immersed in hydrofluoric acid. The immersion takes place by transferring the basket in a second tank (not illustrated) filled with hydrofluoric acid. Hydrofluoric acid has filled the second tank so much as to allow, if the basket containing polysilicon is immersed in the tank, excess hydrofluoric acid to overflow the tank. The overflowed hydrofluoric acid is preferably returned with a pump to the second tank for circulation. Next, as shown in step 16, an aqueous solution of dissolved ozone is jetted at polysilicon contained in the basket removed from the second tank. Next, as shown in step 17, the basket containing polysilicon is immersed in hydrofluoric acid. The immersion takes place by transferring the basket in a third tank (not illustrated) filled with hydrofluoric acid. Preferably for this process, as in step 14, hydrofluoric acid has filled the tank so much that, if the basket containing polysilicon is immersed in the tank, excess hydrofluoric acid may overflow the third tank, and the overflowed hydrofluoric acid may be returned with a pump to the third tank for circulation. Alternatively, a part of the overflowed hydrofluoric acid may be returned with a pump to the second tank used in step 14 for circulation. Next, as shown in step 18, the basket containing polysilicon is immersed in pure water. The immersion takes place by transferring the basket in a fourth tank (not illustrated) filled with pure water. For this process, pure water is preferably heated to a specified temperature (for example, a temperature between 25 and 60° C.). Next, as shown in step 19, polysilicon contained in the basket is dried. The drying takes place by a warm jet of air, or by vacuum drying in an atmosphere consisting of an inert gas such as argon. Lastly, as shown in step 21, dried polysilicon is removed from the basket.

Description has been given above with reference to the embodiment where polysilicon is cleaned while being kept in a chemically resistant basket. However, polysilicon may be cleaned while being moved on a chemically resistant conveyer, instead of being kept in a basket.

Next, an embodiment example of this invention will be described with a comparative example.

(Embodiment Example 1)

Solid polysilicon was treated according to the cleaning steps as described in FIG. 1.

Firstly, solid polysilicon was transferred into a polyethylene basket (step 11). The basket was placed in a tank A, and an aqueous solution of ozone dissolved at 20 ppm was jetted through a nozzle at polysilicon at a rate of 5000 cc/min for three minutes (step 12). Then, the basket containing polysilicon having received the jetting was immersed for five minutes in another tank B which had been filled with the same aqueous solution of ozone having the same ozone concentration (step 13). Then, the basket was removed from tank B, transferred into a still other tank C which had been filled with 0.5 wt. % hydrofluoric acid, and kept there for five minutes (step 14). Then, the basket was removed from tank C, transferred into a still other tank D, and exposed to a jet of an aqueous solution of ozone dissolved at 20 ppm ejected through a nozzle at a rate of 5000 cc/min for three minutes (step 16). Then, the basket was removed from tank D, transferred into a still other tank E which had been filled with 0.5 wt. % hydrofluoric acid, and kept there for five minutes (step 17). Then, the basket was removed from tank E, transferred into a still other tank F which had been filled with pure water, and kept there for 15 minutes (step 18). Then, the basket was removed from tank F, and introduced into a warm air type heater to dry polysilicon (step 19). Lastly, dried polysilicon was removed from the basket (step 21).

(Comparative Example 1)

Cleaning solid polysilicon was achieved by repeating practically the same steps as in Example 1, except that the cleaning steps using an aqueous solution of dissolved ozone were omitted. Specifically, steps 11, 17, 18, 19 and 21 were practiced in this order.

(Comparison and Evaluation)

In Comparative example 1, oxide film with uneven thicknesses naturally developed on the surface of polysilicon were removed with hydrofluoric acid alone, while in Embodiment example 1 application of an aqueous solution of dissolved ozone allowed the formation of an oxide film with a uniform thickness on the surface of polysilicon, which was then removed with hydrofluoric acid, and these steps were repeated. Thus, in Embodiment example 1, the etched amount was larger, and the formation of an oxide film on the surface of polysilicon and the removal of the oxide film from the surface of polysilicon could be achieved more perfectly. A solid polysilicon piece cleaned by the method of Comparative example 1, and another solid polysilicon piece the same with the above but cleaned by the method of Embodiment example 1 were compared for their water repellency after being exposed to drops of pure water. The result showed that the solid polysilicon piece cleaned by the method of Embodiment example 1 was superior in water repellency, as suggested by the above mechanisms underlying the two cleaning methods.

As described above, the method of this invention for cleaning polysilicon comprising cleaning solid or granular polysilicon with an aqueous solution of dissolved ozone and then cleaning it with hydrofluoric acid, and executing the above steps once, or repeating the steps once or more will make it possible to remove organic materials, particles and metal impurities adsorbed on the surface of polysilicon at a low cost, and to, as a result, increase the freeing rate.

What is claimed is:

1. A method for cleaning solid or granular polysilicon to serve as a material for manufacturing a single crystal by melting and polysilicon in a quartz crucible, immersing a crystal seed into the thus obtained melt used raising the crystal seed, comprising steps of cleaning said polysilicon with an aqueous solution of dissolved ozone, and of cleaning with hydrofluoric acid the polysilicon which has undergone the cleaning stop using the aqueous solution of dissolved ozone, wherein the cleaning stop using an aqueous solution of dissolved ozone comprises the steps of jointing an aqueous solution of dissolved ozone at said polysilicon contained in a chemically resistant basket and immersing the basket containing the polysilicon in an aqueous solution of dissolved ozone, and the above steps are executed once in this order, or the above steps are repeated once or more in this order.

2. A method for cleaning solid or granular polysilicon of claim 1 which further comprises, following the last cleaning step using hydrofluoric acid, steps of cleaning said polysilicon with pure water and of drying and cleaned polysilicon.

3. A method for cleaning solid or granular polysilicon of claim 2 wherein the concentration of ozone of the aqueous solution of dissolved ozone is 3 to 20 ppm, and the concentration of hydrofluoric acid is 0.1 to 5 wt. %.

4. A method for cleaning solid or granular polysilicon of claim 1 wherein the concentration of ozone of the aqueous solution of dissolved ozone is 3 to 20 ppm, and the concentration of hydrofluoric acid is 0.1 to 5 wt. %.

5. A method for cleaning solid or granular polysilicon of claim 1 wherein the cleaning step using hydrofluoric acid comprises a step of immersing said polysilicon which is kept in a chemically resistant basket and has been cleaned with an aqueous solutions of dissolved ozone, in hydrofluoric acid.

* * * * *